United States Patent [19]

Bingham et al.

[11] Patent Number: 4,546,324

[45] Date of Patent: Oct. 8, 1985

[54] DIGITALLY SWITCHED ANALOG SIGNAL CONDITIONER

[75] Inventors: David Bingham, San Jose; Lee L. Evans, Atherton; Peter D. Bradshaw, Sunnyvale, all of Calif.

[73] Assignee: Intersil, Inc., Cupertino, Calif.

[21] Appl. No.: 453,237

[22] Filed: Dec. 27, 1982

[51] Int. Cl.[4] .............................................. H03F 1/34
[52] U.S. Cl. ........................................ 330/9; 330/51; 307/353; 328/151
[58] Field of Search ...................... 330/9, 51; 307/353; 328/151, 162

[56] References Cited

U.S. PATENT DOCUMENTS 4,322,687  3/1982  Dwarakanath et al. ................ 330/9

Primary Examiner—James B. Mullins
Attorney, Agent, or Firm—Spensley, Horn, Jubas & Lubitz

[57] ABSTRACT

A digitally switched analog signal conditioner comprising a plurality of pairs of input terminals, a junction, and an output terminal; a plurality of capacitors, first ends of the capacitors being connected to the junction; a plurality of switches being arranged in pairs, first ends of each pair being connected to the other ends of different ones of the capacitors, the other ends of each pair being connected to respective ones of a pair of input terminals, the switches of each pair being adapted to be operated alternatively; an amplifier having an input and an output, the input being operatively coupled to the junction; and a sample and hold circuit operatively coupled to the output of the amplifier for periodically sampling and holding the output, the output of the sampling and holding circuit being connected to one of the input terminals of one of the pairs of input terminals, the other of the terminals of the one pair of input terminals being connected to a point of reference potential.

9 Claims, 7 Drawing Figures

DIGITALLY SWITCHED ANALOG SIGNAL CONDITIONER

BACKGROUND OF THE INVENTION

1. Field of the Invention

The present invention relates to a digitally switched analog signal conditioner and, more particularly, to a precision signal conditioner that can be constructed with imprecise active components and which permits a wide range of precision analog signal conditioning to be achieved, including multiplication, division, addition, subtraction, differentiation and integration using switched or clocked capacitor techniques.

2. Description of the Prior Art

Signal conditioning circuits are generally built around amplifiers and, heretofore, accurate amplifiers of the type for use in precision signal conditioners took the form of an operational amplifier or an instrumentation amplifier. The instrumentation amplifier is the most universal of amplifiers in that it will accept either a single ended input signal or a differential input signal, and will amplify, divide, or condition this input signal, referencing the output signal (if so desired) to another reference voltage level, irrespective of the input signal levels. The reference voltage level may be system ground, or an independent reference voltage, or either input voltage.

Because of the above characteristics, instrumentation amplifiers are highly useful. On the other hand, they are difficult to build and costly. A typical instrumentation amplifier uses three operational amplifiers with very accurately matched resistors. The multiple operational amplifiers and the necessity to accurately match the bias resistors is what results in the difficulty to build instrumentation amplifiers and their cost.

An operational amplifier, on the other hand, is much more simple to build and far less costly. However, an operational amplifier must usually process an input signal with respect to a voltage which is common to both the input and the output. This prevents isolation between the input and the output of the operational amplifier. Consequently, the operational amplifier may be considered to be a special case of an instrumentation amplifier where the reference voltage level is one of the input voltage levels.

Switched capacitor systems are currently being used for comparators. See, for example, copending application Ser. No. 434,893, filed Oct. 18, 1982, entitled High Speed Charge Balancing Comparator and assigned to Intersil, Inc., the assignee of the present application. Switched capacitor systems are also being used in filter systems to provide the equivalent of resistors. However, in most switched capacitor filter regulators, operational amplifiers are used to provide the gain blocks. Switched capacitor amplifiers have not been used heretofore in general purpose analog signal conditioning circuits.

SUMMARY OF THE INVENTION

According to the present invention, there is provided a circuit which permits a wide range of precision analog signal conditioning to be achieved, including multiplication, division, addition, subtraction, differentiation, and integration, using switched or clocked capacitor techniques. As such, the present invention is ideally suited to semiconductor MOS integration including P-channel MOS, N-channel MOS and complementary MOS technologies. The present signal conditioning circuit provides independent input and output referencing, making it suitable for differential instrumentation amplifiers. The present circuit provides an alternative to conventional operational amplifiers and can be configured to provide gain ratios in terms of capacitor ratios or capacitor ratios plus resistor ratios. The present circuit is immune from transistor/component drifts with time, temperature, and voltage effects thereby overcoming one of the principal objections to analog MOS circuits where long term drifts can be orders of magnitude greater than that encountered with bipolar analog circuits. With high clock frequencies, noise in the active gain transistors can be effectively cancelled out, as is the case with all low frequency error sources.

Briefly, the present analog signal conditioner comprises a plurality of pairs of input terminals, a junction, and an output terminal; a plurality of capacitors, first ends of the capacitors being connected to the junction; a plurality of switches being arranged in pairs, first ends of each pair being connected to the other ends of different ones of the capacitors, the other ends of each pair being connected to respective ones of a pair of input terminals, the switches of each pair being adapted to be operated alternatively; an amplifier having an input and an output, the input being operatively coupled to the junction; and a sample and hold circuit operatively coupled to the output of the amplifier for periodically sampling and holding the output, the output of the sampling and holding circuit being connected to one of the input terminals of one of the pairs of input terminals, the other of the terminals of the one pair of input terminals being connected to a point of reference potential.

OBJECTS, FEATURES AND ADVANTAGES

It is therefore the object of the present invention to solve the problems encountered heretofore in achieving a wide range of precision analog signal conditioning using switched or clock capacitor techniques. It is a feature of the present invention to solve these problems by the provision of a novel signal conditioner circuit. An advantage to be derived is that a single circuit permits a wide range of precision analog signal conditioning. Another advantage is a circuit ideally suited to semiconductor MOS integration technologies. Still another advantage is a circuit which provides independent input and output referencing.

Another advantage is a circuit which is suitable for differential instrumentation amplifiers. Another advantage is a circuit which provides an alternative to conventional operational amplifiers. Another advantage is a circuit which can be configured to provide gain ratios in terms of capacitor ratios or capacitor ratios plus resistor ratios. Another advantage is a circuit which is immune from transistor and component drifts with time, temperature, and voltage effects. Another advantage is a circuit which effectively cancels low frequency error sources.

Still other objects, features, and attendant advantages of the present invention will become apparent to those skilled in the art from a reading of the following detailed description of the preferred embodiments constructed in accordance therewith, taken in conjunction with the accompanying drawings wherein like numerals designate like or corresponding parts in the several figures and wherein:

DESCRIPTION OF THE PREFERRED EMBODIMENT

Figure 1:
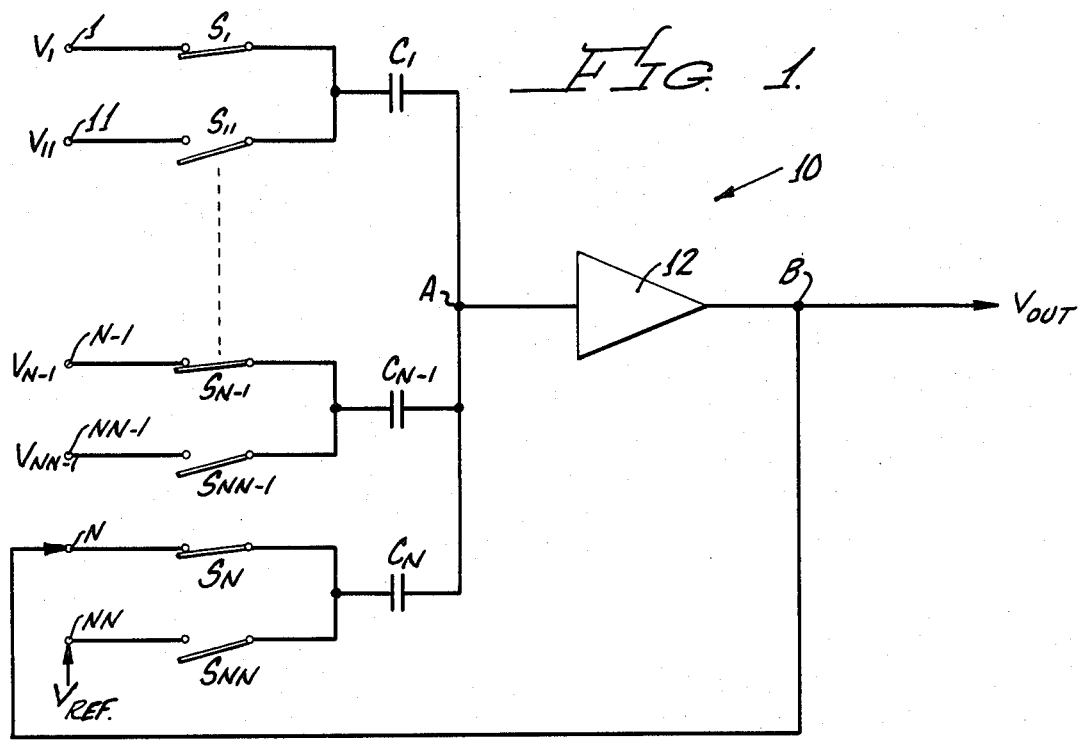
FIG. 1 is a schematic diagram of a signal conditioning circuit constructed in accordance with the teachings of the present invention.

Referring now to the drawings and, more particularly, to FIG. 1, there is shown a digitally switched analog signal conditioner, generally designated 10, constructed in accordance with the present invention. More specifically, signal conditioner 10 includes a plurality of pairs of input terminals $1, \ldots N$ and $11, \ldots NN$, a junction A and an output terminal B. A plurality of capacitors $C_1, \ldots C_N$ have first ends thereof connected to junction A. Switches $S_1, \ldots S_N$ apply voltages $V_1, \ldots V_N$, respectively, applied to terminals $1, \ldots N$, respectively, via capacitors $C_1, \ldots C_N$, respectively, to junction A. Similarly, switches $S_{11}, \ldots S_{NN}$ apply voltages $V_{11}, \ldots V_{NN}$, respectively, applied to terminals $11, \ldots NN$, respectively, via capacitors $C_1, \ldots C_N$, respectively, to junction A. Switches $S_1, \ldots S_N$ are operated in sequence during an autozero phase and switches $S_{11}, \ldots S_{NN}$ are operated in sequence during a charge compare phase. During the autozero phase, switches $S_1, \ldots S_N$ will be closed and switches $S_{11}, \ldots S_N$ will be open whereas during the compare phase, the reverse situation is the case.

Junction A is connected to the input of an amplification and sample and hold circuit, generally designated 12, which will be described more fully hereinafter, the output of which is connected to output terminal B. Output terminal B provides the output voltage of signal conditioner 10, which output voltage is also applied to one of the input terminals of one of the pairs of input terminals, here shown as input terminal N. The other input terminal of the same pair of input terminals is connected to a point of reference potential, here shown as $V_{REF}$.

A series of pairs of signals $V_1, V_{11}, \ldots V_{N-1}, V_{NN-1}$ and at least one output signal are connected through capacitors $C_1, \ldots C_N$ to the input of circuit 12. According to the preferred embodiment of the present invention, there are two primary phases, the autozero phase and the charge compare phase. There may be more in practice, but signal conditioner 10 requires only two phases for the theory of operation. During the autozero phase, the input of circuit 12 may be considered to be at ground and the voltages forced onto capacitors $C_1, \ldots C_N$ are $V_1, \ldots V_{N-1}, V_{out}$. During the charge compare phase the voltages forced onto capacitors $C_1, \ldots C_N$ are $V_{11}, \ldots V_{NN-1}, V_{REF}$. If the condition given in equation (1) below is satisfied, no net charge is injected into junction A and, consequently, the voltage at junction A remains unchanged.

$$0 = C_1(V_1 - V_{11}) + \\ C_2(V_2 - V_{22}) + \ldots C_{N-1}(V_{N-1} - V_{NN-1}) + C_N(V_{out} - V_{REF}) \quad (1)$$

or $$V_{out} = \frac{C_1(V_1 - V_{11}) + \ldots C_{N-1}(V_{N-1} - V_{NN-1}) + C_N V_{REF}}{C_N}$$

If a net charge is injected into junction A and the voltage at this point changes during the compare phase compared to the autozero phase, the output voltage $V_{out}$ will change to compensate. Under ideal conditions, full compensation is acheived in one full clock cycle (consisting of the autozero phase and the charge compare phase). In practice, and as will be discussed more fully hereinafter, more than one cycle is usually required to achieve the required accuracies (typically better than 90% compensation).

The requirements for circuit 12 are (a) low input leakage currents, (b) high open loop gain, (c) low output impedance if the clocking frequency is high and/or $C_N$ is high in value, and (d) the drift of the internal components must be negligible during a clock period (but may be substantial over a very large number of clock periods). Assuming these conditons are met, some very useful properties for signal conditioner circuit 10 can be achieved.

Figure 2:
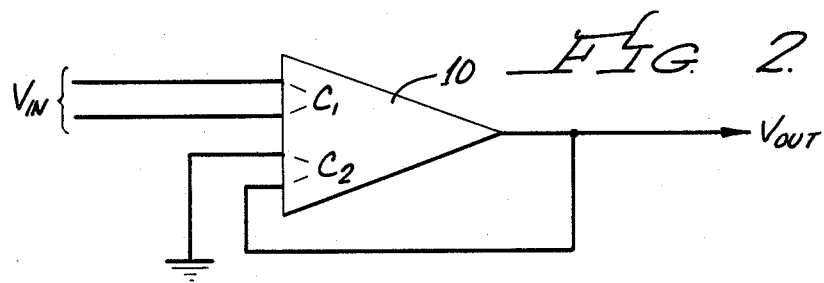
FIG. 2 is a simplified diagram of the circuit of FIG. 1 used as an instrumentation amplifier.

By way of example, each input and output pair is isolated from one another so that signal conditioner 10 can be used as an instrumentation operational amplifier with terminal NN tied to ground, if required. The equivalent circuit for such an operational amplifier is shown in FIG. 2. In such a case, $$V_{out} = \frac{C_1}{C_2} V_{in}$$

In such a case, $V_{out}$ is referenced to ground. Also, one terminal of $V_{in}$ would typically be connected to ground.

Figure 3:
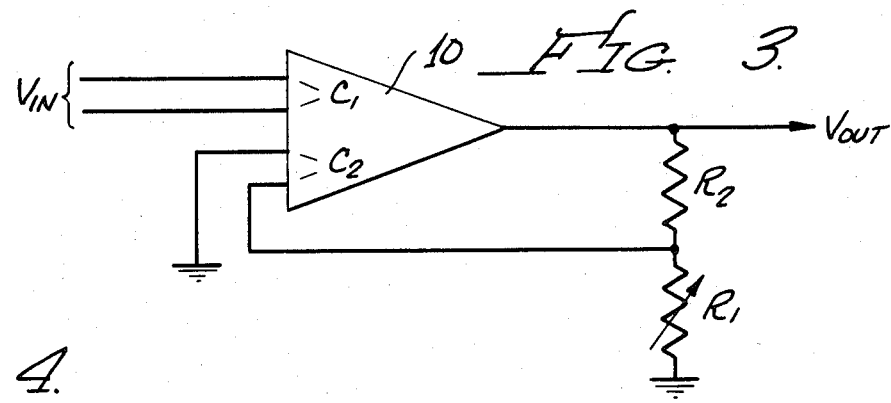
FIG. 3 is a simplified diagram of the circuit of FIG. 1 used with an output resistor divider.

With reference to FIG. 3, signal conditioner 10 may be used to provide variable gain with the use of an output potentiometer or resistor divider. That is, $V_{out}$ may be connected to ground via a resistor divider consisting of resistors $R_1$ and $R_2$, $R_1$ being variable and the junction between resistors $R_1$ and $R_2$ being connected to terminal N. For such a circuit, $$V_{out} = \frac{C_1}{C_2} \frac{(R_1 + R_2)}{R_1} V_{in}$$

Figure 4:
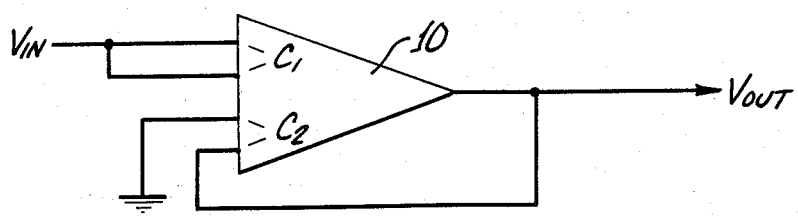
FIG. 4 is a simplified diagram of the circuit of FIG. 1 used as a differentiator.

Referring now to FIG. 4, signal conditioner 10 may be used as a differentiator if the input terminals are connected together and if the clock frequency is selected to provide the desired output scaling factor. With such a circuit configuration, $$V_{out} = \frac{C_1}{C_2} \times \frac{\Delta V_{in}}{T}$$

where T=one clock period.

As can be seen from the previous discussion, signal conditioner 10 has many of the desirable properties of operational amplifiers plus some important additional advantages such as true input/output isolation and no susceptibility to long term (with respect to the the clock frequency) drift mechanisms due to varying supply voltages, temperature or aging effects or the like.

Figure 5:
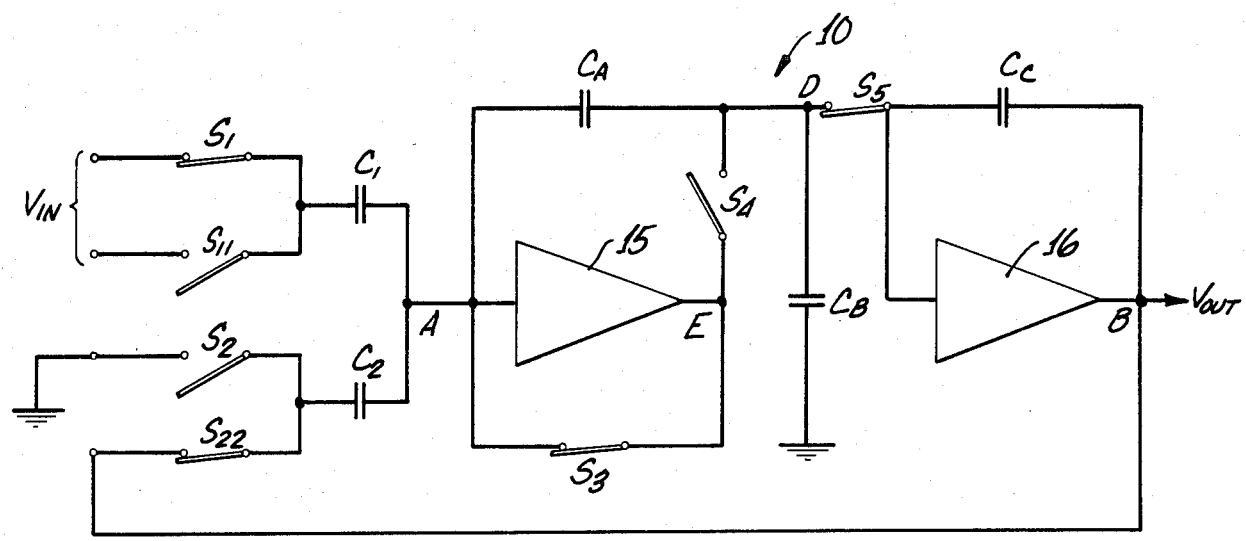
FIG. 5 is a more complete schematic diagram of the circuit of FIG. 1 with a single input pair.

Referring now to FIG. 5, circuit 12 consists of two basic components, a charge compare amplifier 15 and a sample and hold circuit including an amplifier 16. The sample and hold circuit is required because signal conditioner 10 is a clocked system and output information must be stored during the autozero phase so that the output signal is continuous. Junction A is connected to the input of amplifier 15, the output of which is designated as junction E. Junction E is connected back to junction A via a switch $S_3$ thereby clamping the input voltage to the output voltage at node E. Junction E is also connected via a switch $S_4$ to a junction D which is connected to junction A via a capacitor $C_A$. Junction D is also connected to ground by means of a capacitor $C_B$ and to the input of amplifier 16 by means of a switch $S_5$. The output of amplifier 16, junction B, is connected to the input thereof via a capacitor $C_C$.

For the purposes of discussing the circuit of FIG. 5, it will be assumed that amplifiers 15 and 16 have infinite voltage gains, require no DC input bias currents, and have no significant leakage currents. During the autozero phase, switches $S_1$, $S_{22}$, $S_3$ and $S_5$ are closed and the remaining switches are open. During the charge compare phase, switches $S_{11}$, $S_2$ and $S_4$ are closed and the remaining switches are open. A break before make sequence is preferably implemented on each switch closure.

At this point, another concept must be introduced in the understanding of circuit 10, namely its stability factor (SF). It will be shown that signal conditioner 10 is stable for any value of SF if $$0 \leq SF < 2$$

and is unstable for any value equal to or greater than 2. It will also be shown that a change of $V_{in}$ produces a change of $V_{out}$ every complete clock cycle. If the change of $V_{out}$ is such that it has fully compensated the change of $V_{in}$ ($\Delta V_{in}$) after one cycle, the system is critically damped (SF=1). If, however, the change of $V_{out}$ is less than that needed to fully compensate $V_{in}$, the system is underdamped and requires more than one clock cycle to achieve output voltage parity ($0 \leq SF < 1$). If the compensation is too much, the output will overshoot and ring ($1 < SF < 2$) and will also require more than one cycle. If the output is overcompensated such that $SF \geq 2$, the system will oscillate.

The above can be proven mathematically as follows. Assume signal conditioner 10 has stabilized such that the voltage at junction A does not attempt to change between the autozero phase or the charge compare phase. Next, change the input voltage by $\Delta V_{in}$. Thus, during the compare phase, the output of amplifier 15 will change so that at junction D:

$$\Delta V_D = \frac{C_1}{C_A} \Delta V_{in}. \tag{2}$$

It should be noted that switch $S_4$ is closed during the compare phase and the change of output voltage will also be impressed on capacitor $C_B$. Capacitor $C_B$ is shown here only because in most practical implementations of signal conditioner 10, the capacitance $C_B$ is a significant percentage of capacitance $C_A$. There may be implementations where this is not so and $C_B$ could then be ignored.

During the subsequent autozero phase, the change of voltage ($\Delta V_D$) at junction D will be impressed on the output voltage in accordance with the following relation:

$$\Delta V_{out} = \frac{(C_A + C_B)}{C_C} \Delta V_D. \tag{3}$$

Combining equations (2) and (3):

$$\Delta V_{out} = \frac{C_1}{C_A} \times \frac{(C_A + C_B)}{C_C} \times \Delta V_{in}. \tag{4}$$

The charge injected into junction A during the next compare phase will be:

$$\Delta V_{in} C_1 - \Delta V_{out} C_2$$

or $$\Delta V_{in} C_1 - \Delta V_{in} C_2 \frac{C_1}{C_2} \frac{(C_A + C_B)}{C_C}.$$

Hence, no charge will be injected into junction A if:

$$1 = \frac{C_2}{C_A} \frac{(C_A + C_B)}{C_C}$$

and the system will have fully adjusted for the input voltage change $\Delta V_{in}$.

If $$1 > \frac{C_2}{C_A} \frac{(C_A + C_B)}{C_C}.$$

then the output voltage change ($\Delta V_{out}$) will be less than fully compensated and will require additional clock cycles to be more fully compensated. If, on the other hand, $$1 < \frac{C_2}{C_A} \frac{(C_A + C_B)}{C_C} < 2,$$

the output will overshoot, and, if equal to or greater than 2, the system is unstable and will oscillate since the signal fed back to junction A will be larger than the resultant signal at this point due to $V_{in}$.

Figure 6:
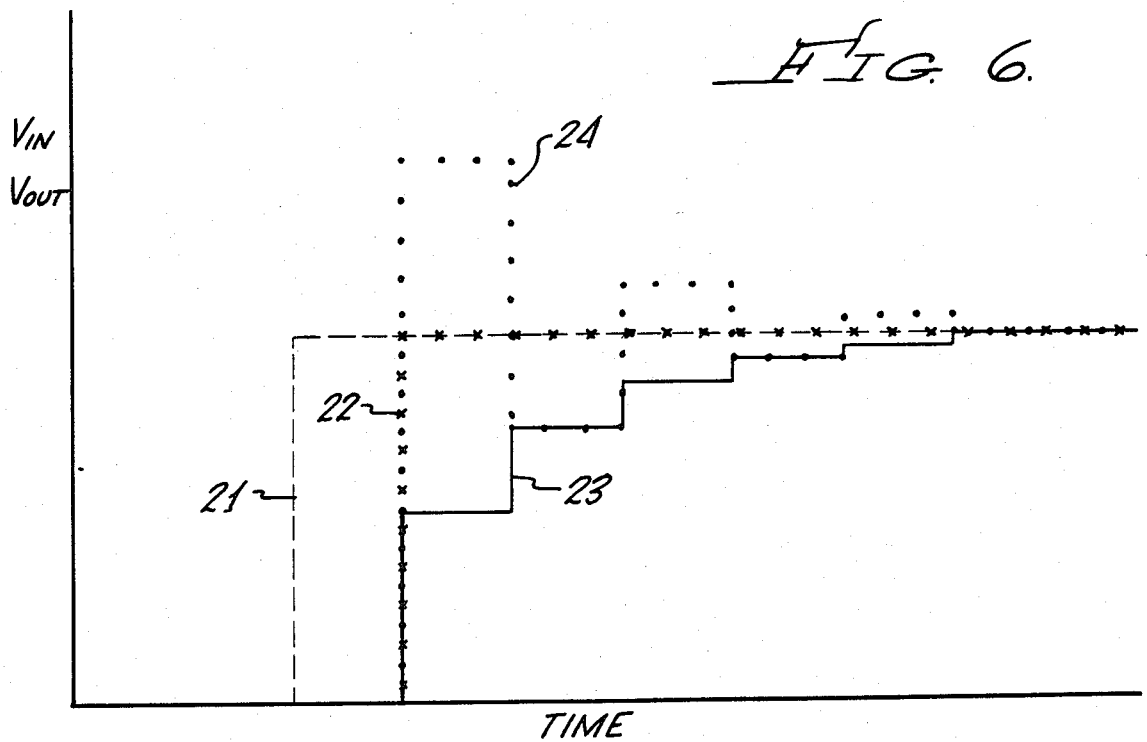
FIG. 6 is a plot of input and output voltage as a function of time for various stability factors for the circuit of FIG. 5.

The above is diagrammed in FIG. 6 where $V_{in}$ and $V_{out}$ are plotted against time. Waveform 21 shows the input signal $V_{in}$, waveform 22 is $V_{out}$ for SF=1.0, waveform 23 is $V_{out}$ for SF=0.5 and waveform 24 is $V_{out}$ for SF=1.5.

It should be noted that if an output resistor divider as shown in FIG. 3 is used, then although the gain is varied by the choice of $R_1$ and $R_2$, the stability factor is also changed accordingly such that $$SF = \frac{C_2}{C_A} \frac{(C_A + C_B)}{C_C} \frac{R_1}{(R_1 + R_2)}$$

The optimum implementation of signal conditioner circuit 10 is with MOS semiconductor technologies whereby the switches can be replaced with MOS transistors and the high input impedance of the MOS transistors are ideal for the inputs of amplifiers 15 and 16. Amplifiers 15 and 16 may be differential operational types requiring compensation for unity gain stability.

Figure 7:
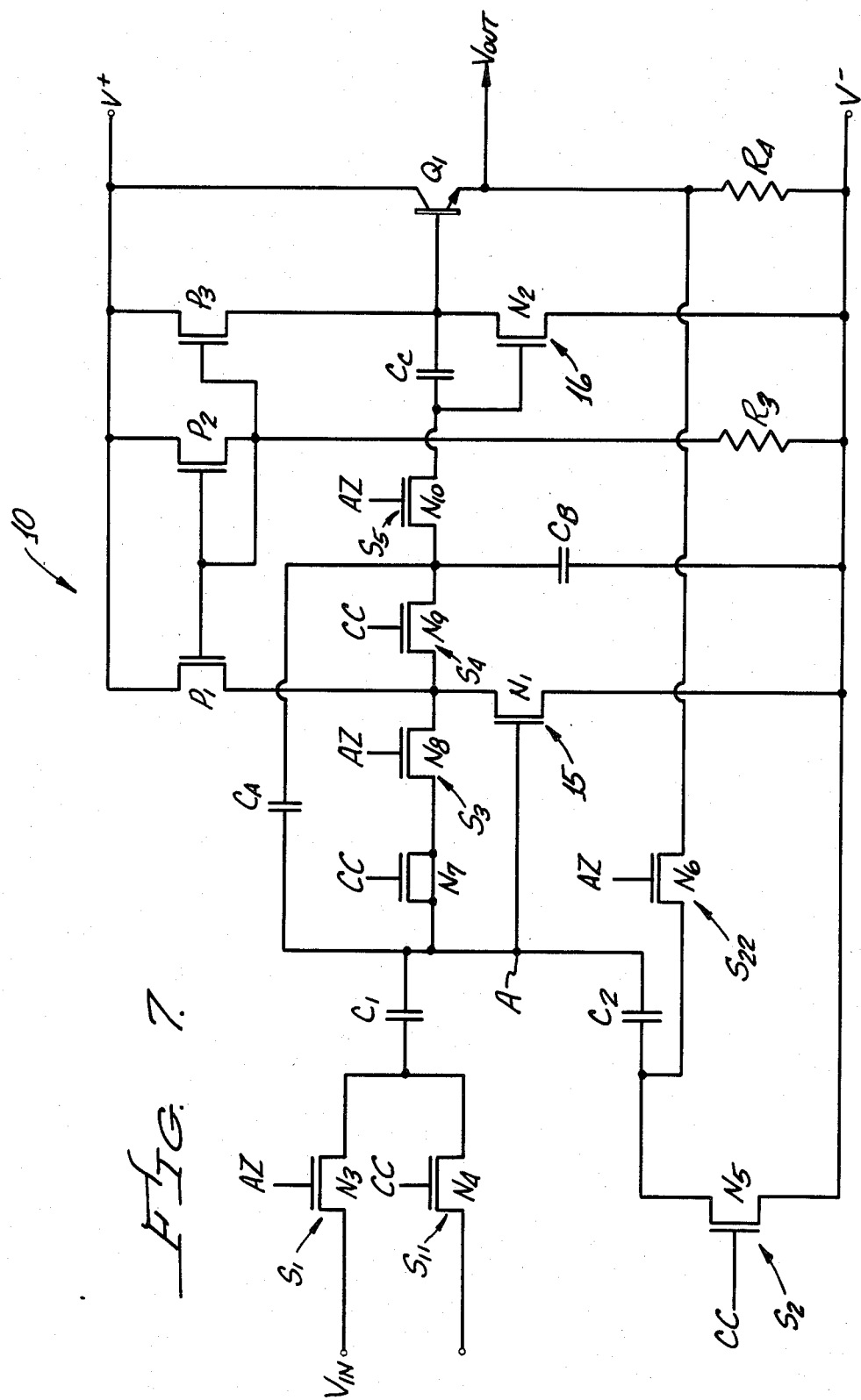
FIG. 7 is a circuit diagram of a practical implementation of the circuit of FIGS. 1 and 5.

Referring now to FIG. 7, there is shown a complete circuit diagram of signal conditioner circuit 10 with one input differential pair. There are many other versions using P-MOS, N-MOS and CMOS that could be used as an equivalent of the shown in FIG. 7. In FIG. 7, corresponding components have been given the same numbers. Switches $S_1$ through $S_5$, $S_{11}$ and $S_{22}$ are N-channel transistors $N_3$, $N_5$, $N_8$, $N_9$, $N_{10}$, $N_4$ and $N_6$, respectively. These switches receive the two phase clocks during the autozero (AZ) and charge compare (CC) phases which have no overlapping edges (break before make). Charge compare amplifier 15 used a single N-channel amplifier $N_1$ and transistor $N_8$ has a charge compensation transistor $N_7$ in series therewith to balance out the clock feed-through capacitance. Only the charge compare node A is sensitive to switch charge injection. If system offsets or output error voltages on the order of 5 mV are acceptable, transistor $N_7$ is not required. Transistor $N_7$ can be reduce output voltage errors to less than 1 mV.

Sample and hold amplifier 16 consists of a single N-channel transistor $N_2$ and the hold capacitor is, again, $C_C$. The output of amplifier $N_2$ is buffered by a transistor $Q_1$, an NPN transistor available with P-well CMOS technologies. Transistors $P_1$, $P_2$ and $P_3$ and resistors $R_3$ and $R_4$ make up the biasing scheme. In the embodiment of FIG. 7, the reference voltages are $V+$ and $V-$ and each of the clock signals alternates between $V+$ and $V-$.

With the circuit shown in FIG. 7, practical gains are possible in the range of 1/150 to 150, practical stability factors lie within the range 0.95 to 1.05, clock frequency range is 100 Hz to 500 kHz, a typical gain accuracy is 1% or better, and the supply voltage range swing is 1.5 volts to 30 volts. However, these figures are not limited to those shown but are given to demonstrate a single practical design. For other technologies, other parameter ranges may be more suitable.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. A signal conditioning circuit comprising:
   and least one pair of input terminals for first and second input signals, respectively;
   amplification means for amplifying an input signal, said amplification means having an input node and also having an output for an output signal;
   a plurality of charge storing members coupled to said input node of said amplification means;
   means for alternatively coupling the input terminals via one of said charge storing members to said input node of said amplification means; and
   means for alternatively feeding back the output of said amplification means and a reference signal via a second one of said charge storing members to said input node of said amplification means.

2. A signal conditioning circuit according to claim 1, wherein said charge storing members are capacitors.

3. A signal conditioning circuit according to claim 1 or 2, further comprising:
   means coupled to the output of said amplification means for periodically sampling and holding said output signal, the output of said sampling and holding means being alternately fed back to said input of said amplification means.

4. The circuit of claim 1 further comprising:
   means for clamping the voltage of the amplification means input node to a fixed voltage while the first input terminal is coupled to said one charge storing member and the amplification means output is fed to said second one of said charge storing members.

5. A signal conditioning circuit comprising:
   a plurality of pairs of input terminals, a junction, and an output terminal;
   a plurality of capacitors, first ends of said capacitors being connected to said junction;
   a plurality of switches being arranged in pairs, first ends of each pair being connected to the other ends of different ones of said capacitors, the other ends of each pair being connected to respective ones of a pair of input terminals, the switches of each pair being adapted to be operated alternately;
   amplification means having an input and an output, said input being operatively coupled to said junction; and
   means operatively coupled to said output of said amplification means for periodically sampling and holding said output, the output of said sampling and holding means being connected to said output terminal and to one of the input terminals of one of said pairs of input terminals, the other of said terminals of said one pair of input terminals being connected to a point of reference potential.

6. A signal conditioning circuit according to claim 5, further comprising:
   first switch means and first capacitor means connected in series between said output and said input of said amplification means; and
   second switch means connected between said output and said input of said amplification means, said first and said second switch means being adapted to be operated alternately.

7. A signal conditioning circuit according to claim 6, wherein said sampling and holding means comprises:
   second amplification means having an input and an output; and
   second capacitor means connected between said output and said input of said second amplification means.

8. A signal conditioning circuit according to claim 7, further comprising:
   third switch means operatively connected between said input of said second amplification means and the junction between said first switch means and said first capacitor means.

9. A signal conditioning circuit according to claim 8, further comprising:
   third capacitor means connected between said point of reference potential and said junction between said first switch means and said first capacitor means.

* * * * *